United States Patent [19]

Sacks

[11] 4,219,099

[45] Aug. 26, 1980

[54] ACOUSTIC REPRODUCTION TRANSDUCER ENCLOSURE

[76] Inventor: Bernard Sacks, 7640 SW. 143 St., Miami, Fla. 33158

[21] Appl. No.: 840,857

[22] Filed: Oct. 11, 1977

[51] Int. Cl.$^2$ .................... H05K 5/00

[52] U.S. Cl. .................... 181/153; 181/144; 181/156

[58] Field of Search .................... 181/156, 153, 148, 159, 181/160, 152, 144, 147, 199; 179/1 E

[56] References Cited

U.S. PATENT DOCUMENTS

| | | | |
|---|---|---|---|
| 1,741,274 | 12/1929 | Baumann | 181/156 |
| 1,971,442 | 8/1934 | Dimmick | 181/148 |
| 2,787,332 | 4/1957 | Fulmer | 181/156 |
| 3,068,955 | 12/1962 | Van Hedel | 181/144 |
| 3,135,348 | 6/1964 | Bill | 181/147 |
| 3,746,125 | 7/1973 | Hammes | 181/199 |
| 3,892,288 | 7/1975 | Klayman et al. | 181/156 |
| 3,945,461 | 3/1976 | Robinson | 181/153 |
| 3,952,159 | 4/1976 | Schott | 181/156 |

FOREIGN PATENT DOCUMENTS

| | | | |
|---|---|---|---|
| 1225845 | 2/1960 | France | 181/156 |

*Primary Examiner*—L. T. Hix

*Assistant Examiner*—Thomas H. Tarcza

*Attorney, Agent, or Firm*—Eyre, Mann, Lucas & Just

[57] ABSTRACT

An acoustic loudspeaker is mounted within a curved reflecting enclosure. Openings through the enclosure allow sound vibrations from the front of the speaker to emerge from the enclosure. A port in the enclosure, spaced away from the openings allow vibrations from the rear of the speaker to emerge from the enclosure. The inside of the enclosure is shaped to direct the desired vibrations through the port. A second embodiment has two speakers and two ports non-interferingly mounted in a single reflecting enclosure.

4 Claims, 8 Drawing Figures

ACOUSTIC REPRODUCTION TRANSDUCER ENCLOSURE

BACKGROUND OF THE INVENTION

High fidelity sound reproduction using a cone-type loudspeaker, is hampered by interference between the sound vibrations set up at the front of the cone and those set up at the rear. If the vibrations at the rear are allowed to travel unrestricted to the front, constructive and destructive acoustic interference at different frequencies will seriously distort the frequency response. Previous workers have mounted speakers in boxes with the front of the cone facing the room and the interior of the box containing sound-absorbing material. The problem of interference from the rear of the speaker was thus solved by absorbing approximately half the acoustic energy generated by the speaker. A further solution, called an airsuspension speaker enclosure, provided the speaker sealed to one face of an air-tight box. Again, approximately half the acoustic energy was wasted in the box.

A further problem with loudspeakers, particularly at low frequencies, is obtaining adequate acoustic coupling between the speaker cone and the air. One solution has been to use a very large speaker cone, for example 24 inches and larger. Another solution has been to make the speaker cone very compliant thus allowing very large physical excursions and thereby moving a large quantity of air. Although these solutions improve the low-frequency performance, they degrade the mid- and high-frequency performance sufficiently that three, four and more speakers, each fed a particular range of frequencies from an electric network, are required to reproduce the useful acoustic spectrum of from about 30 to about 20,000 hertz. Another way of achieving acoustic coupling employs an air column inside a divergent horn. In theory, each acoustic frequency is able to find a cross-sectional area of the horn at which an acoustic impedance match with the air is achieved.

One approach to solving both the back-to-front interference problem and the low-frequency coupling problem has been called the tuned-port speaker enclosure. In a tuned-port speaker enclosure, the front of the speaker faces the room, with or without a horn-type device in the path, while the rear of the speaker faces a passage of considerable length, usually folded to reduce its physical dimensions, which terminates in a port usually adjacent to and facing in the same direction as the front of the speaker. The dimensions and length of the passage delays the emergence of the acoustic energy from the rear of the speaker enough that interference is avoided. Furthermore, the horn-like nature of the passage can be made to improve the acoustic coupling of certain frequencies between the speaker and the air. Tuned-port enclosures require sturdy, relatively large and massive structures to contain the acoustic pressures generated in them without adding their own vibrational distortion to the emerging sound.

DETAILED DESCRIPTION OF THE PREFERRED EMBODIMENT

Figure 1:
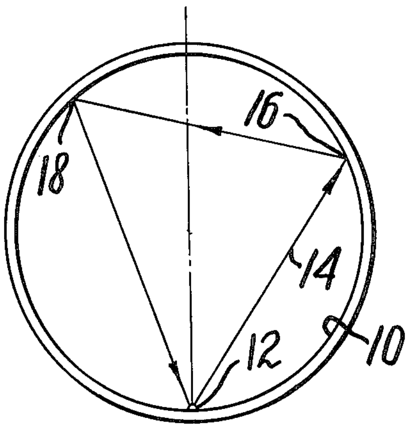
FIG. 1 shows the tracing of acoustic rays emanating from a point source inside a sphere.

Referring first to FIG. 1, there is shown for purposes of description a theoretical hollow sphere 10 of perfectly acoustically reflecting material. At the inner surface of sphere 10, a point source 12 of acoustic energy is located. Elementary geometry indicates that each acoustic ray emerging from the point source will, after one, two or more reflections, return to the point source 12. For example, acoustic ray 14 reflects at points 16 and 18 to return to the point source 12. The reflection process just described is independent of acoustic frequency.

Figure 2:
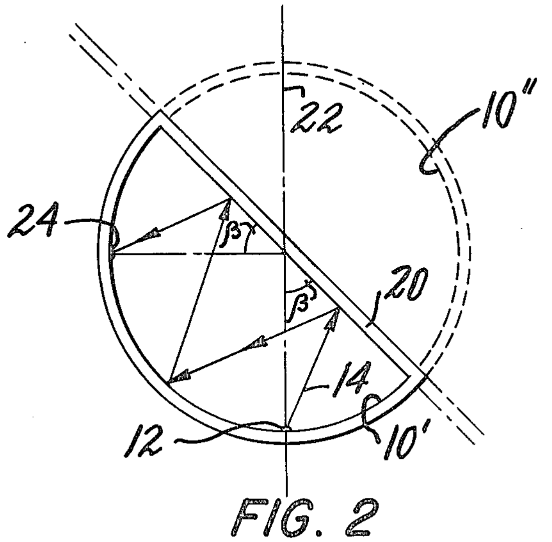
FIG. 2 shows the tracing of rays inside a hemisphere closed by a reflecting plate.

In FIG. 2, the sphere 10 has been divided into two hemispheres 10' and 10'' by passing a plane reflecting plate 20 through the sphere at an angle B to the diameter 22 which passes through the point source 12. Hemisphere 10'' may be discarded as shown by the dashed lines. As is shown, acoustic ray 14, instead of returning to the source 12 as was the case with the full sphere, now travels to a virtual source 24 displaced around the hemisphere 10' from the point source 12. The angle B between the reflecting plate 20 and the line between the virtual source 24 and the sphere center equals the angle between the reflecting plate 20 and the line between the point source 12 and the center of the sphere. If an opening were made in theoretical hemisphere 10' at the virtual source 24, essentially all of the acoustic energy generated by the point source 12 would pass through to the exterior.

Figure 3:
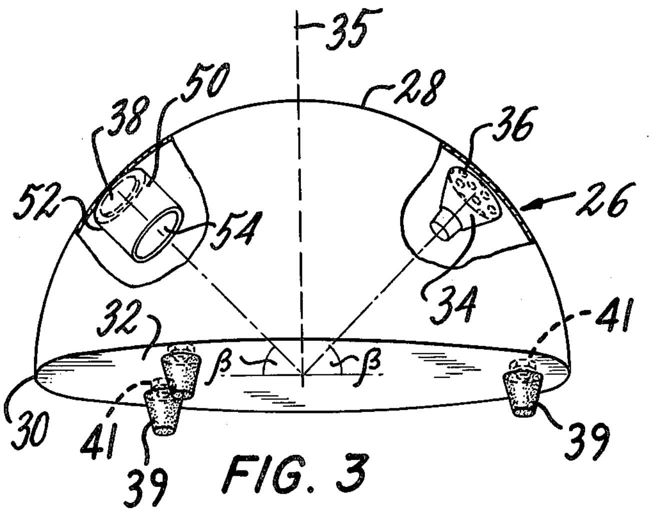
FIG. 3 shows a schematic perspective view of a first embodiment of the present invention.
Figure 4:
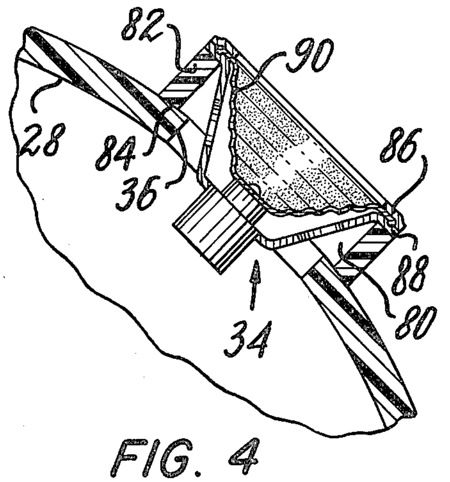
FIG. 4 shows an enlarged fractional detailed cross section of a method of mounting a loudspeaker.

Turning now to FIG. 3, there is shown generally at 26 a first practical embodiment of the invention. A hollow hemispheric dome 28 of reflecting material is sealed at its perimeter 30 to a plane plate 32 of reflecting material. A loudspeaker 34 is mounted inside the sphere 28 angularly intermediate the pole 35 and the perimeter 30 with its cone facing the inner surface of the sphere 28. The loudspeaker 34 is electrically driven by well known means not shown. Direct sound exit means such as a single opening or a plurality of openings 36 are provided through the sphere 28 in front of the loudspeaker 34 in order to allow direct exit of the acoustic energy from the front of the loudspeaker 28. A horn (not shown) or other acoustic matching means may be used in front of the loudspeaker 34 either inside or outside the sphere 28 without departing from the spirit and intent of this invention. In addition, loudspeaker 34 may comprise two or more independently or commonly driven loudspeakers arranged either coaxially or in a cluster. Furthermore, at least part of the loudspeaker 34 may be external to the hemisphere 28, as shown in FIG. 4, in which case the single or plurality of openings 36 may be employed to allow entry of the acoustic energy into the hemisphere 28. An external chamber 80 may be formed outside the inner surface 28 using, for example a ring 82 sealed at its first end 84 to the outer surface of the enclosure. A flange 86 on the loudspeaker 34 is sealably attached to the second end 88 of the ring 82. The paper or fabric loudspeaker cone 90 substantially closes and seals the opening 36 against the passage of air therethrough. The structure shown in FIG. 4 accommodates the fact that a real loudspeaker is a source of acoustic energy considerably larger than the theoretical point source used in the description of FIGS. 1 and 2. By moving the speaker partially out of the enclosure, an equivalent source, which appears to be intermediate the voice coil and the flange of the loudspeaker, can be more nearly positioned in alignment with the inner surface of the enclosure.

Figure 5:
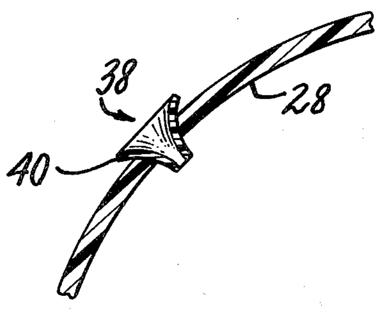
FIG. 5 shows a divergent horn acoustic coupling device.
Figure 6:
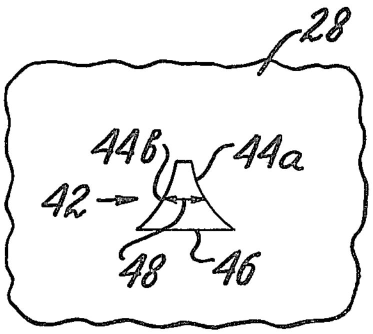
FIG. 6 shows a port having a truncated double-hyperbola shape.

A port 38 is located in the surface of the hemisphere 28 at a location 180 degrees from the speaker 34 in the horizontal plane and approximately equal to the elevation angle B in the vertical plane. The port 38 thus assumes the position of the virtual source 24 shown and discussed in connection with FIG. 2. Changing the size and shape of the port 38 has been found to modify the frequency response of the speaker enclosure system. A divergent horn coupling unit may be connected to the port 38 as shown at 40 in FIG. 5. This may have the tendency to broaden frequency response of the system. The port 38 may have any shape. For example, it may have the truncated double-hyperbola shape shown at 42 in FIG. 6. The opening 42 is bounded by facing hyperbolae 44*a*, 44*b* and is truncated for example by a straight line 46. For each audio frequency within its range there exists a transverse dimension in the opening 42, for example, dimension 48 indicated by the double arrows, which efficiently couples the audio frequency to the room. Thus, the double-hyperbola port 42 functions analogously to a divergent horn.

Returning now to FIG. 3, the port 38 may optionally be encircled by a tube 50 which is substantially sealed to the inside of the sphere 28 at its outer end about the perimeter of the port 38 and is open at its inner end 54. The tube 50 may be of any shape including conical, ellipsoidal, parabolic-divergent or convergent, hyperbolic divergent or convergent, but the preferred embodiment is cylindrical. It has been found that varying the length and diameter of the tube 50 changes the frequency response of the speaker enclosure system. The length of the tube 50 can be made adjustable by using telescoping sections (not shown) which allows the user to tune the system to best match the acoustic characteristics of his room. The tube 50 may have one or more openings in its side to further tune the system. Although the length of the tube 50 may be varied, good performance has been found with distance from the inner end 54 of the tube 50 to the inner surface of the sphere 28 approximately equal to the distance from the voice coil of the speaker 34 to the inner surface of the sphere 28.

A series of rings or other means (not shown) having different inner diameters or shapes may be inserted in the port 38 to change its effective diameter or shape in order to allow the user to tune the system to match the acoustic characteristics of his room.

It will be clear to one reading this specification that the shape of the outer surface of the enclosure of the present invention is immaterial; the critical shape being the inside surface. Thus, for example, the hemispherical inner surface could be formed in a body of material having a rectangular outer shape. It will also be clear that only the inner surface of the body need be substantially acoustically reflecting. Thus, for example, a hemispheric cavity could be formed in an absorbing body, such as rigid plastic foam and then the inner surface could be made rigid and reflecting using, for example, a cured coating of plastic resin such as epoxy with or without reinforcing fabric such as a fabric woven of glass fibers. The enclosure can also be cast, molded or machined out of any suitable material such as plastic, compressed cellulosic fiber, mineral fiber, or metal or it may be laid up on a mold using one or more layers of fabric reinforcing impregnated with settable resin. Satisfactory results have been achieved with a hemisphere vaccum formed of acrylic sheet and closed with a flat reflecting plate of acrylic sheet.

It will also be clear to one reading the specification, that an infinite number of source points for the location of the speaker 34 exists in the hemispherical embodiment in FIG. 3. Satisfactory results have been achieved with the speaker 34 centered at a point on the sphere where a line from the center of the plate 32 elevated 45 degrees from the plane of the plate 32 intersects the inner surface. It will also be clear that, having chosen the source point on the hemisphere 28, one and only one related virtual source point exists for location of the port 38.

The enclosure 26 may be supported on a plurality of legs 39 secured to the plane plate 32 by any suitable means such as nuts 41. Placement of the legs 39 has been found to reduce the vibration of the enclosure 26 under high acoustic loading. Best results are observed in an eighteen-inch hemisphere using three legs 39 attached to the plane plate 32 spaced 120 degrees apart and located about one inch inward from the perimeter 30 where the hemispheric dome 28 is sealed to the plane plate 32. Other numbers and locations of supporting legs may be found which reduce the vibration of the enclosure 26. Alternatively, the enclosure may be suspended using the same support points as previously described for leg attachment.

Figure 7:
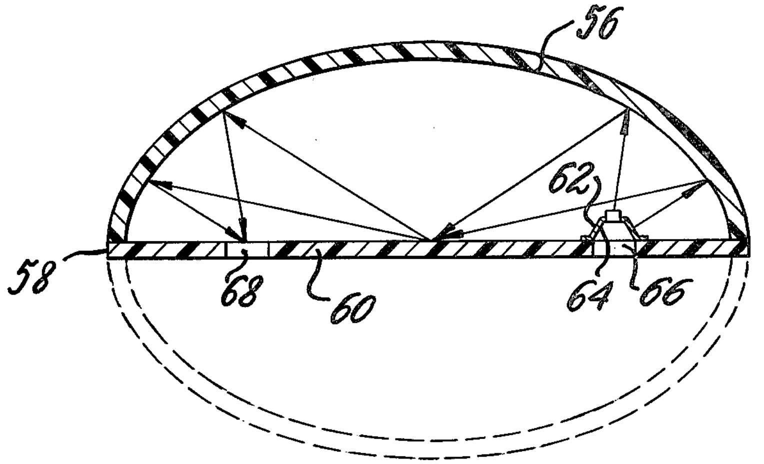
FIG. 7 shows an embodiment of the invention using a semi-ellipsoid closed by a flat reflecting plate.

Other figures of revolution, including paraboloids and ellipsoids may be employed in whole or in part according to the present invention to provide reflection of acoustic energy within such a shaped body from its source to a virtual source spaced apart from the source. For example, a second embodiment of the invention in FIG. 7 shows a cross section of a reflecting semi-ellipsoidal inner surface 56 sealed at its perimeter 58 to a plane reflecting plate 60. A speaker 62 may direct acoustic energy directly outward from its front surface 64 through an opening 66 in the reflecting plate 60. The speaker 62 and opening 66 are positioned in the plate 60 approximately where a first focus of the full ellipsoid (completed by dashed lines) would be located. A port 68 is positioned in the plate 60 approximately where the second focus of the full ellipsoid would be located. In a manner analogous to the ray tracing described for the spherical surface, it is readily shown that acoustic energy from the rear of the speaker 62 is reflected one, two or more times to the port 68. The port 68 can be optionally equipped with acoustic coupling devices and/or an internal tuning tube as previously described.

Since the speaker 62 must be located at one of the two foci of the ellipsoid, this embodiment does not permit selection of a source point from among an infinite number of possibilities as was the case for the spherical enclosure previously described. When the speaker 62 is located at one of the foci, the port 68 must then necessarily be located at the other focus.

Figure 8:
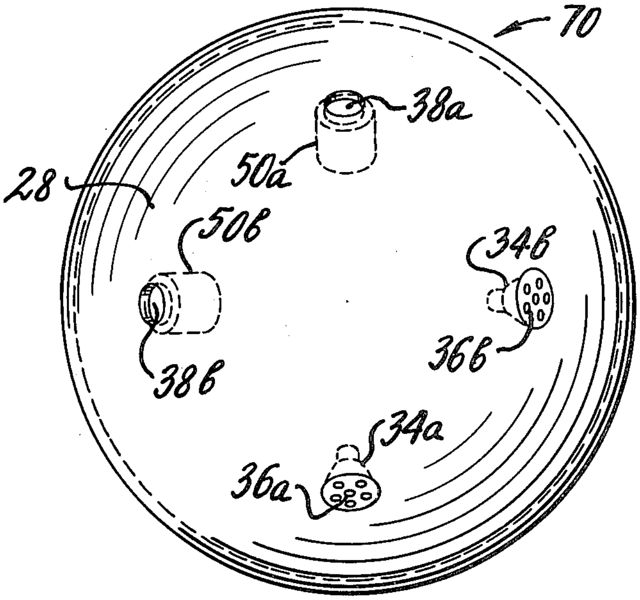
FIG. 8 shows an enclosure in which two loudspeakers with associated ports operate in a single enclosure independently of each other.

Referring now to FIG. 8, there is shown generally at 70 a plan view of a third embodiment of the invention. The third embodiment employs a concave hemispheric reflecting surface 28. A first loudspeaker 34*a* and a second loudspeaker 34*b* are mounted inside the concave hemispheric reflecting surface 28. The first and second loudspeakers 34*a*, 34*b* are angularly spaced apart. For best results they should be located 90 degrees apart horizontally and at the same elevation but other angular relationships may give satisfactory performance. Openings 36*a* and 36*b* permit the exit of acoustic energy from the front surfaces of first and second loudspeakers 34*a* and 34*b* respectively. A first port 38*a* is located in the surface 28 approximately 180 degrees horizontally from, and at substantially the same elevation as said first loudspeaker 34*a*. A second port 38*b* is located in the surface 28 approximately 180 degrees horizontally from, and at substantially the same elevation as said second loudspeaker 34*b*. Tuning tubes 50*a* and 50*b* may be optionally associated with said first and second ports 38*a* and 38*b* respectively.

Since the interaction of the acoustic energy at the rear of a speaker with its associated port in the present invention depends on the relative positioning of speaker and port, the two speaker-port combinations in FIG. 8 can operate substantially without the mutual interference in a single enclosure completely open inside. For example, the first port 38*a* works as described with its associated first loudspeaker 34*a* but the relative geometry of the second port 38*b* with respect to either the first speaker 34*a* or the first port 38*a* substantially precludes interaction between them. The inverse is also true. Thus both first and second speakers 34*a* and 34*b* may be operated simultaneously without substantial interaction between their acoustic energy.

It will be understood that the claims are intended to cover all changes and modifications of the preferred embodiments of the invention, herein chosen for the purpose of illustration which do not constitute departures from the spirit and scope of the invention.

What is claimed is:

1. In a loud speaker system of the type having a loud speaker for the reproduction of sound, said loud speaker being attached to an enclosure, the improvement comprising:

(a) said enclosure having a concave substantially reflecting inner surface;

(b) the shape of said inner surface defining for a source point of acoustical energy on its inner surface one and only one virtual source point of acoustical energy on said inner surface, said virtual source point being spaced from its corresponding source point;

(c) said inner surface being a concave reflecting hemisphere connected at its extremity and enclosed by a substantially plane reflecting plate;

(d) a hole through said enclosure centered at a selected source point;

(e) said selected source point being located in said hemisphere angularly intermediate of said plane reflecting plate and its pole;

(f) means for sealingly mouting said loud speaker aligned with said hole;

(g) said corresponding virtual source point being located 180° horizontally about said pole from said source point and as the same elevation angle above said plate at said source point; and (h) a port in said enclosure, said port being located at said virtual source point.

2. The loudspeaker recited in claim 1 wherein said means for mounting includes means for locating at least part of said loudspeaker outside said hemisphere.

3. The loudspeaker recited in claim 2 wherein said included means comprises:

(a) a cylindrical ring having first and second ends (b) said ring being sealingly affixed to said enclosure with its axis aligned with and substantially centered on the radius of said hemisphere which passes through said source point;

(c) a flange on the perimeter of said loudspeaker;

(d) said cylindrical ring having inner and outer diameters corresponding to said flange; and (e) said flange being sealably attached to said cylindrical ring.

4. In a loudspeaker system of the type having a loudspeaker for the reproduction of sound, said loudspeaker being attached to an enclosure, the improvement comprising:

(a) said enclosure having a substantially reflecting inner surface;

(b) said inner surface being a hemisphere closed by a plane surface;

(c) means for mounting said loudspeaker on said hemisphere angularly intermediate said plane surface and the pole of said hemisphere;

(d) at least one opening aligned with said means for mounting for permitting the passage of acoustic vibrations from said speaker directly through said enclosure;

(e) a port through said enclosure;

(f) said port being located on said hemisphere at a location 180 degrees horizontally about said pole and at substantially the same angle between said plane surface and said pole as said means for mounting said loudspeaker;

(g) a cylindrical tuning tube affixed to said inner surface completely about the perimeter of said port;

(h) the axis of said cylindrical tuning tube being along a radius of said hemisphere;

(i) said tuning tube being open at its inner end; and (j) said tuning tube having a length less than the radius of said hemisphere.

* * * * *